US009160290B2

(12) United States Patent
Berkhout et al.

(10) Patent No.: US 9,160,290 B2
(45) Date of Patent: Oct. 13, 2015

(54) CLASS D AMPLIFIER AND CONTROL METHOD

(75) Inventors: Marco Berkhout, Tiel (NL); Benno Krabbenborg, Arnhem (NL)

(73) Assignee: NXP B.V., Eindhoven (NL)

( * ) Notice: Subject to any disclaimer, the term of this patent is extended or adjusted under 35 U.S.C. 154(b) by 478 days.

(21) Appl. No.: 13/593,231

(22) Filed: Aug. 23, 2012

(65) Prior Publication Data

US 2013/0049718 A1    Feb. 28, 2013

(30) Foreign Application Priority Data

Aug. 25, 2011    (EP) .................................. 11178895

(51) Int. Cl.
| | | |
|---|---|---|
| G05F 1/56 | (2006.01) | |
| H03F 3/217 | (2006.01) | |
| H03F 1/52 | (2006.01) | |

(52) U.S. Cl.
CPC .............. H03F 3/2173 (2013.01); H03F 1/52 (2013.01)

(58) Field of Classification Search
CPC ..... H03F 3/217; H03F 3/2171; H03F 3/2172; H03F 3/2173; H03F 1/52
USPC ........................................................ 330/251
See application file for complete search history.

(56) References Cited

U.S. PATENT DOCUMENTS

| | | | | |
|---|---|---|---|---|
| 5,805,020 A | * | 9/1998 | Danz et al. ................... 330/251 |
| 5,973,368 A | * | 10/1999 | Pearce et al. ................. 330/251 |
| 5,973,569 A | * | 10/1999 | Nguyen ........................ 330/251 |
| 6,518,837 B2 | | 2/2003 | Berkhout | |
| 7,816,985 B2 | | 10/2010 | Attwood et al. | |
| 2001/0010482 A1 | | 8/2001 | Oki et al. | |
| 2004/0169553 A1 | * | 9/2004 | Maejima ........................ 330/10 |
| 2005/0253648 A1 | * | 11/2005 | Shin ............................... 330/10 |
| 2007/0236286 A1 | | 10/2007 | Kobayashi et al. | |
| 2009/0097178 A1 | | 4/2009 | Krishnan et al. | |
| 2011/0188163 A1 | * | 8/2011 | Ando ............................. 327/63 |

FOREIGN PATENT DOCUMENTS

| | | |
|---|---|---|
| CN | 1822493 A | 8/2006 |
| CN | 101855828 A | 10/2010 |
| EP | 2562933 A1 | 2/2013 |

OTHER PUBLICATIONS

Berkhout, M. "Integrated Overcurrent Protection System for Class-D Audio Power Amplifiers", IEEE J. of Solid-State Circuits, vol. 40, No. 11, pp. 2237-2245 (Nov. 2005).

Morrow, P. et al. "A 20-W Stereo Class-D Audio Output Power Stage in 0.6-μm BCDMOS Technology", IEEE J. of Solid-State Circuits, vol. 39, No. 11, pp. 1948-1958 (Nov. 2004).

Extended European Search Report for EP Patent Appln. No. 11178895.6 (Dec. 23, 2011).

* cited by examiner

*Primary Examiner* — Jue Zhang

(57) ABSTRACT

A Class D power amplifier is for driving a load between first and second output nodes defined between two bridges. A controller is adapted to derive an amplifier hold signal when an overcurrent state is detected in an output bridge, and to prevent switching of the other output bridge between the two main output states.

11 Claims, 6 Drawing Sheets

(a)

(b)

(a)

(b)

CLASS D AMPLIFIER AND CONTROL METHOD

CROSS-REFERENCE TO RELATED APPLICATIONS

This application claims the priority under 35 U.S.C. §119 of European patent application no. 11178895.6, filed on Aug. 25, 2011, the contents of which are incorporated by reference herein.

This invention relates to class D amplifiers, and relates to the prevention of coincidental high current switching in Class-D amplifiers.

Class-D amplifiers are commonly used as speaker drivers in consumer, automotive and mobile applications.

Class-D amplifiers are switch-mode amplifiers meaning the output node(s) are switched between the supply rails usually employing some form of pulse-width modulation (PWM). Because the power transistors are either fully on or fully off for most of the time, this results in high efficiency that is the defining feature of class-D amplifiers. A less attractive side effect of switch mode operation is the occurrence of high current transients in the supply and ground rails. In combination with parasitic inductance in the supply and ground lines these current transients cause significant voltage excursions at the supply and ground terminals of a class-D output stage.

A simplified schematic of a typical class-D half-bridge output stage is shown in FIG. 1(a). It consists of a very large PMOS transistor ($M_H$) connected between the supply line $V_{SUP}$ and the output node, and a very large NMOS power transistor ($M_L$) connected between the ground line $V_{GND}$ and the output node. Note that a configuration with only NMOS transistors is also possible.

Two logic signals "gatehigh" and "gatelow" indicate if the corresponding power transistor is on (the signal=1) or off (the signal=0) by comparing the power transistor gate voltage ($V_{GH}$ and $V_{GL}$) to a threshold value. A control logic block 10 controls the gate drivers 12 of the power transistors $M_H$, $M_L$ using the input signal "in" and the "gatehigh" and "gatelow" signals. The "gatehigh" and "gatelow" signal or similar signals are generally available in class-D output stages to implement a break-before-make mechanism.

FIG. 1(a) also shows an input signal "enable" to the control logic 10. This is a signal which is pulled low to implement shut down of the amplifier.

In many applications a so-called Bridge-Tied-Load (BTL) configuration is used that consists of two complementary half-bridges as shown in FIG. 1(b). One half-bridge A has high and low transistors $M_{HA}$, $M_{LA}$ and the other half-bridge B has high and low transistors $M_{HB}$, $M_{LB}$. Each half-bridge has comparators for deriving the "gatehigh" and "gatelow" logic signals, as well as control logic, but these are not shown in order to simplify FIG. 1(b).

In the BTL configuration, the output load (for example a loudspeaker as shown) is connected between the output nodes $V_{OUTA}$ and $V_{OUTB}$ of the two half-bridges. The loudspeaker can be modelled as a series connection of a resistor and an inductor, e.g. 8 Ω/68 µH, 4 Ω/33 µH.

Usually, the half-bridges in a BTL power stage share the same supply and ground pins and thus also the same parasitic conductance between the on-chip ground and supply nets and the external ground and supply. These parasitic inductances are the result of bonding wires and PCB tracks.

Consider what happens when power transistors $M_{HB}$ and $M_{LA}$ are conducting and a large current is flowing through the load in the direction indicated in FIG. 2(a). In this situation the current is sustained by the inductance in the load and is increasing rapidly but can be considered constant on the timescale of interest.

Next, the lowside power transistor $M_{LA}$ is opened and subsequently highside power transistor $M_{HA}$ is closed causing a rising edge at node $V_{OUTA}$. Consequently, the current is now forced to flow in a loop as shown in FIG. 2(b) and the current that was flowing through the parasitic inductances $L_{SUP}$ and $L_{GND}$ drops to zero. This sudden current drop causes a positive voltage excursion on internal supply node $V_{SUPi}$ and a negative voltage excursion on internal node $V_{GNDi}$. The magnitude of these voltage excursions depends on the value of the parasitic inductances and the rate of change of the current.

Next, the highside power transistor $M_{HB}$ is opened and subsequently lowside power transistor $M_{LB}$ is closed causing a falling edge at node $V_{OUTB}$. Consequently, the current is now forced to flow from ground to supply as indicated in FIG. 2(c) and through parasitic inductances $L_{SUP}$ and $L_{GND}$ again but now in opposite direction compared to the situation in FIG. 2(a).

This sudden current increase in the parasitic inductances $L_{SUP}$ and $L_{GND}$ again causes a positive voltage excursion on internal supply node $V_{SUPi}$ and a negative voltage excursion on internal node $V_{GNDi}$.

In FIG. 3(a) the simulated voltage transients on the output nodes $V_{OUTA}$ and $V_{OUTB}$ and the internal supply and ground nets $V_{SUPi}$ and $V_{GNDi}$ are shown. For the parasitic inductances $L_{SUP}$ and $L_{GND}$ a value of 1 nH has been used and the external supply voltage is 5V. FIG. 3 shows the voltage transients for non coinciding edges (FIG. 3(a)) and for coinciding edges (FIG. 3(b)).

In example of FIG. 3(a) there is a 20 ns delay between the rising edge of $V_{OUTA}$ and the falling edge of $V_{OUTB}$. As can be seen, both transitions cause significant voltage excursions on the internal supply and ground nets $V_{SUPi}$ and $V_{GNDi}$. In this case, the maximum drain-source voltage that appears across the nodes of lowside NMOS power transistor $M_{LA}$ is 9.2V which is 4.2V higher than the supply voltage.

In FIG. 3(b) the voltage transients are shown in case the output transitions coincide, i.e. the rising edge of node $V_{OUTA}$ and the falling edge of node $V_{OUTB}$ occur at exactly the same moment. As can be seen, the voltage excursions on the internal supply and ground nets $V_{SUPi}$ and $V_{GNDi}$ are now much larger. The maximum drain-source voltage across the nodes of lowside NMOS power transistor $M_{LA}$ is now 12.2V which is 3V higher than in the previous case. The voltage excursions caused by the separate output transitions add up when the transitions coincide and have opposite direction.

The large voltage overshoots seen by the power transistors are a robustness hazard. Especially the NMOS transistors are vulnerable because they typically exhibit a destructive bipolar mode that is triggered when the drain-source voltage exceeds a critical value.

In mobile applications ternary or BD-modulation is widely preferred because it allows for filterless application. If no signal is applied, the output signals $V_{OUTA}$ and $V_{OUTB}$ are switching synchronously with 50% duty-cycle. In this case the differential signal across the loudspeaker and therefore also the output current is zero. If a signal is applied the duty-cycles of $V_{OUTA}$ and $V_{OUTB}$ change in opposite direction, e.g. if the duty-cycle of $V_{OUTA}$ increases then the duty-cycle of $V_{OUTB}$ decreases and vice versa. This results in a three level differential signal across the load as shown in FIG. 4, which shows the BD-modulation.

Consequently, with BD modulation the critical condition described earlier, where opposite output transitions coincide, appears to be avoided. However, there are two exceptions.

The first exception, that will be called the overcurrent coincidence, occurs when the current through one of the power transistors crosses a limit current. Usually the output stage is equipped with an overcurrent protection that prevents damage in case of short-circuits. If the overcurrent protection is triggered the corresponding power transistor is switched off immediately to prevent a further increase in current. If this event coincides with an output transition of the opposite half-bridge this creates exactly the critical condition described earlier.

The second exception, that will be called the shutdown coincidence, occurs when the amplifier is switched off. In this case all power transistors are switched off simultaneously and if at that moment the output current is large this also creates exactly the critical condition described earlier. Both these mechanisms have been observed in practice to be the cause of robustness problems in class-D amplifiers.

According to the invention, there is provided a Class D power amplifier for driving a load between first and second output nodes, comprising:

a first output half-bridge comprising first, highside, and second, lowside, transistors in series between power rails, with the first output node between the first and second transistors;

a second output half-bridge comprising third, highside, and fourth, lowside, transistors in series between power rails, with the second output node between the third and fourth transistors;

a first controller of the first output half-bridge for generating the gate drive signals for the highside and lowside transistors in the first output half-bridge; and a second controller of the second output half-bridge for generating the gate drive signals for the highside and lowside transistors in the second output half-bridge, wherein the controllers are adapted to:

derive an amplifier hold signal when an overcurrent state is detected in the respective output half-bridge, and to prevent switching of the other output half-bridge based on the hold signal.

The invention provides an arrangement in which the bridge-halves (in a full-bridge Class D amplifier) are prevented from switching high currents at exactly the same moment. In order to do so the bridge-halves need to communicate with each other.

The invention provides a simple control approach, which can for example be implemented as a simple asynchronous logic circuit, to prevent the occurrence of coincident high current switching, particularly in a bridge-tied-load (BTL) class-D output stage. In this way, the situation where inductive voltage excursions at the supply and ground rails add up to a potentially destructive amplitude is avoided.

The controllers can each comprise an asynchronous logic circuit for generating the amplifier hold signals. This provides a simple implementation.

The asynchronous logic circuit can comprise, for each output half-bridge, a first latch for generating a first output if overcurrent is detected in the lowside transistor and the output state of the half-bridge is a first state in which the half-bridge pulls its output node down, and a second latch for generating a second output if overcurrent is detected in the highside transistor and the output state of the half-bridge is the one in which the half-bridge pulls its output node up, wherein an output half-bridge hold signal comprises the logical OR of the first and second outputs.

The latches enable the overcurrent detection signals to be short pulses.

The controllers can be further adapted to:

use the amplifier hold signal to prevent switching of the other output half-bridge out of the first and second output states if the switching has not commenced; and return the other output bridge to the first or second output states if the switching out of the state has commenced but switching off of a transistor has not been completed.

In this way, the transition between the output states can be inhibited, or even reversed if the transition is only partially complete.

The controllers can be further adapted, in response to a signal to shut down the amplifier, to delay shutdown of one output half-bridge with respect to the other half-bridge only if one half-bridge output is high and the other is low.

This avoids shut down coincidence when one half-bridge output is high and the other is low. Shut down at the same time can thus be avoided when the outputs of the bridge-halves are not equal, whereas they can shut down at the same time when they are switching in-phase.

A shut down signal for each output half-bridge can be delayed only if the half-bridge output has predetermined value, and the predetermined value is the same for the two output half-bridges. This means no communication is needed between the half-bridges—the delay is implemented simply based on the output of the same output half-bridge.

An asynchronous logic circuit can be used to implement the delay.

The amplifier of the invention can be used as the output stage of a DC-DC boost converter.

A logic circuit can then be used for generating a boost stage hold signal based on the state of the amplifier output half-bridges, such that switching of the boost stage is prevented when switching of the amplifier is taking place.

The invention also provides a method of controlling a Class D power amplifier which drives a load between first and second output nodes, the amplifier comprising:

a first output half-bridge comprising first, highside, and second, lowside, transistors in series between power rails, with the first output node between the first and second transistors; and a second output half-bridge comprising third, highside, and fourth, lowside, transistors in series between power rails, with the second output node between the third and fourth transistors, wherein the method comprises:

for each output half-bridge controlling the output half-bridge to define a first output state in which the output half-bridge pulls the first output node down to the low power rail, and a second output state in which the output half-bridge pulls the output node up to the high power rail;

deriving an amplifier hold signal when an overcurrent state is detected in one output half-bridge, and using the hold signal to prevent switching of the other output half-bridge between the first and second output states.

Examples of the invention will now be described in detail with reference to the accompanying drawings, in which.

The invention provides a Class D power amplifier for driving a load between first and second output nodes defined between two half-bridges. For each half-bridge a controller is adapted to derive an amplifier hold signal when an overcurrent state is detected in that output half-bridge, and this hold signal is used to prevent switching of the other output half-bridge between the two main output states.

Figure 5:
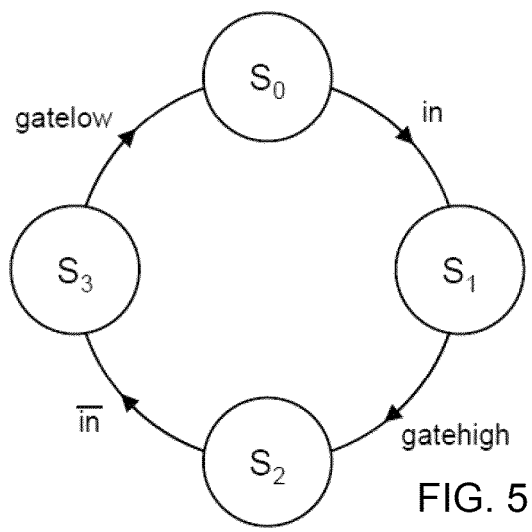
FIG. 5 shows a state diagram for the control of the amplifier design of FIG. 1(a) as implemented by the control logic.

The invention is based on the recognition that to avoid an overcurrent coincidence the bridge-halves need to be aware if the other bridge-half is in the middle of or starting a transition. For this purpose a signal can be generated that flags the start and finish of each transition. This signal can be easily generated since the sequence of events during a transition is fixed. For example during a falling transition the following sequence of events occurs:

1. Start discharge gate of highside transistor
2. Wait for highside gate voltage to cross threshold voltage (optional)
3. Start charging gate of lowside transistor
4. Wait for lowside gate voltage to reach final value During a rising edge the same sequence is followed with the highside and lowside transistors interchanged. This sequence is enforced by a (known) asynchronous state machine in the control logic as shown in FIG. 5 having input signals "in", "gatelow" and "gatehigh". During state $S_0$ the output is low and during state $S_2$ the output is high, and in each case waiting for the next transition.

Assuming the output of the half-bridge is low, and the state machine is in state $S_0$, then a rising edge of the input signal "in" marks the start of an output transition. The state-machine jumps to state $S_1$ that starts the discharging of the lowside gate and charging of the highside gate.

When the highside gate reaches its final value, the signal "gatehigh" goes high. This marks the end of the transition and the state-machine jumps to state $S_2$. For a falling edge, the transition starts when the state-machine jumps to state $S_3$ after a falling edge of input signal "in". The transition ends when signal "gatelow" goes high (i.e. the lowside transistor has turned on) and the state-machine jumps to $S_0$, completing the cycle.

The invention aims to prevent overcurrent coincidence, and this is achieved in that an overcurrent protection mode is triggered. For this, two logic signals "oc_high" and "oc_low" are introduced that flag the occurrence of an overcurrent in the highside power transistor or lowside power transistor respectively. The "oc_high" and "oc_low" signal or similar signals are generally available in class-D output stages as explained in more detail in Berkhout, M., "Integrated Overcurrent Protection System for Class-D Audio Power Amplifiers", IEEE Journal of Solid-State Circuits, vol. 40, no. 11, pp. 2237-2245, 2005.

Overcurrent protection is used to ensure that the power transistors operate in their safe operating area (SOA). For class D amplifiers, the SOA can be defined as a current limit. The current through the power transistors can be measured by placing low-ohmic resistors in series between the power lines and the power transistors, and measuring the voltage drops. To improve accuracy and to enable full circuit integration, the current can be determined by comparing the drain to source voltage of each power transistor with a reference transistor through which a reference current is known to flow. The article "Integrated Overcurrent Protection System for Class-D Audio Power Amplifiers" referenced above presents an approach in which overcurrent logic is additionally used to process the control signals before application to the control logic.

The overcurrent detection signals to be used in the amplifier of the invention can be of any type, including the basic voltage drop measurement approach as well as the more complicated approaches explained in "Integrated Overcurrent Protection System for Class-D Audio Power Amplifiers".

In a known way of implementing overprotection, when overcurrent is detected in one output half-bridge, the input signal "in" for the control logic state machine of that output half-bridge is toggled to switch off the appropriate power transistor and prevent damage. In this way, the output half-bridge is switched to prevent damage.

The same approach of protecting an output half-bridge is employed in the amplifier and method of the invention. However, in addition, there is communication between the output half-bridges, so that the switching of one output half-bridge in response to overcurrent detection can be made to take place at a different timing instants to normal switching of the other output half-bridge. Simultaneous switching in response to overcurrent detection can also be avoided by use of a priority scheme.

Figure 6:
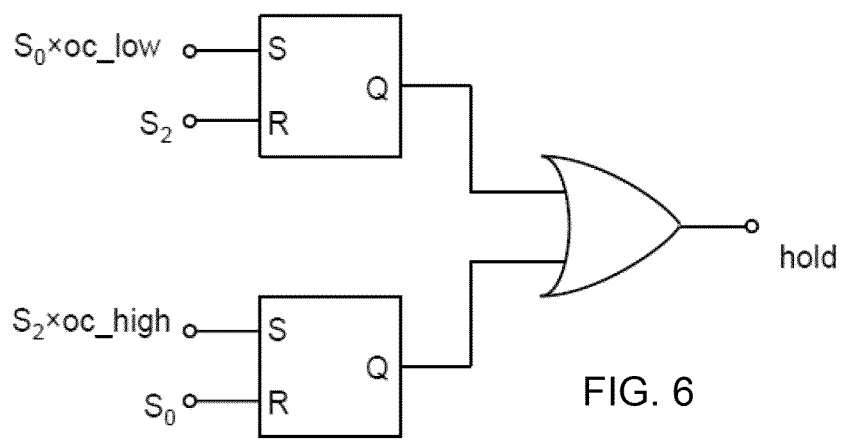
FIG. 6 shows how a hold signal is generated for use in the amplifier design of the invention.

The invention makes use of a logic signal which will be termed "hold", that goes high when an overcurrent occurs in one half-bridge. This is used to avoid switching coincidence by preventing the other half-bridge from switching. The required "hold" signal can be derived easily from the available signals, for example using a logic circuit, for example as shown in FIG. 6.

The circuit comprises two set-reset latches and an OR gate. The Set input to each latch is a logic AND signal which requires the state machine to be in the correct state and the overcurrent signal to be present in the transistor that is turned on for that state—one latch is triggered (to the Set input) by the state machine being in the low output state $S_0$ and the "oc_low" signal is received, and the other is triggered by the state machine being in the high output state $S_2$ and the "oc_high" signal is received. If either of these overcurrent signals is received, a hold signal is generated by the OR logic.

The latches are needed because the "oc_low" or "oc_high" flag goes low as soon as the corresponding power transistor is switched off, i.e. during the transition, so that a Reset is only provided at the next output state.

Figure 7:
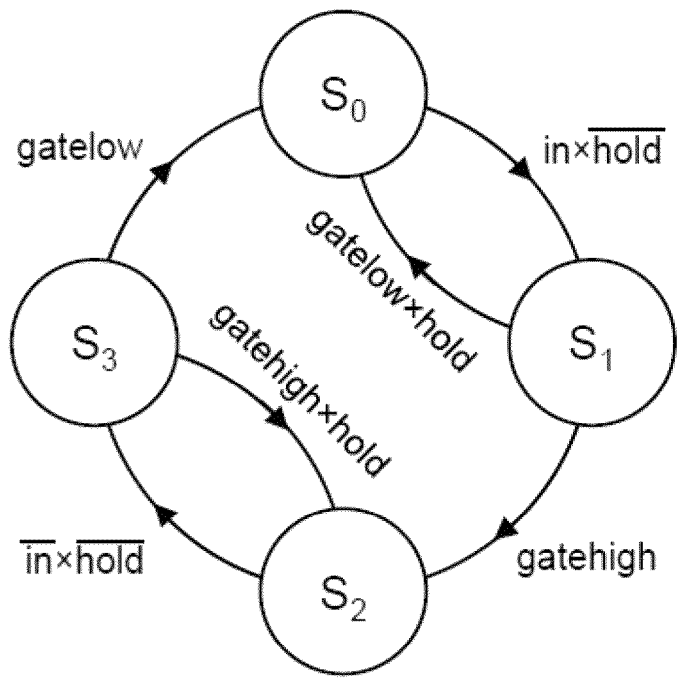
FIG. 7 shows a state diagram for the control of the amplifier design of the invention.

The hold signal from one bridge-half is transmitted to the other bridge-half to prevent it from switching. To do so the state-machine of FIG. 5 is modified as shown in FIG. 7.

The control of the state in which the circuit is operating is by the control logic, which generates the required timing signals for controlling the power transistor gates.

The transition out of state $S_0$ or state $S_2$ is only allowed if the hold signal is low.

Also, if the hold signal is high, there is a transition back from the intermediate states $S_3$ and $S_1$ to the preceding states $S_2$ and $S_0$ if the transistor gate signals have not yet completed its change. For example, in state $S_3$, which is the transition from high ($S_2$) to low ($S_0$), if the highside transistor is still conducting (gatehigh=1) when a hold signal is received, then the logic returns to state $S_2$. If the "gatehigh" signal has already gone low, the transition to the low state $S_0$ is allowed.

Thus, in the modified state-machine, the transitions from state $S_0$ to $S_1$ and from $S_2$ to $S_3$ are blocked when the hold signal is high. Furthermore, if the state-machine is in state $S_1$, i.e. after the output transition has already started, it can revert back to state $S_0$ as long as the "gatelow" signal is high, i.e. as long as the lowside gate is not fully discharged. This is similar to the reversal from state $S_3$ and the "gatehigh" signal as explained above.

The modified state-machine and hold signal generation are implemented in both bridge-halves such that the hold signal from bridge-half A taps into the state-machine of half-bridge B and vice versa.

Figure 3:
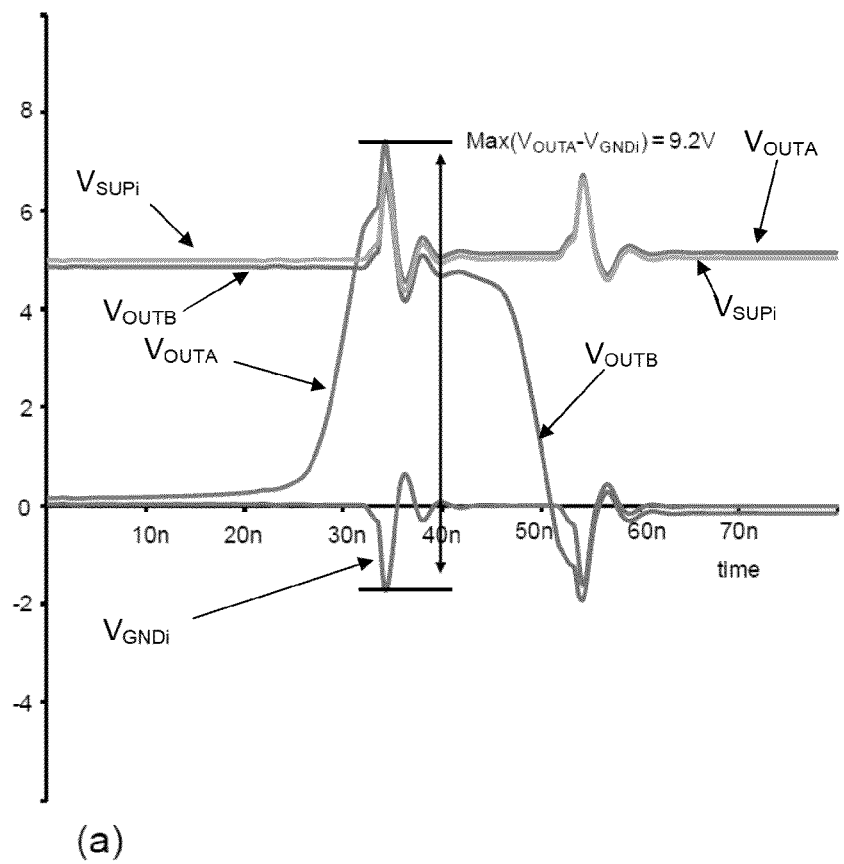
FIG. 3 shows two examples of voltages that arise during switching of the amplifier design of FIG. 1(b)
Figure 3:
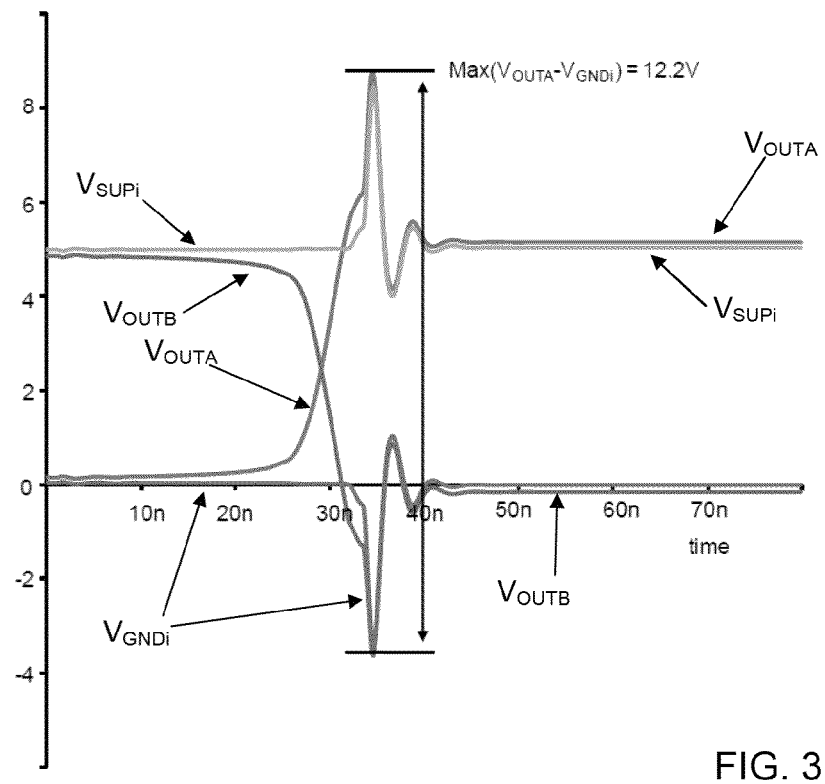
Figure 4:
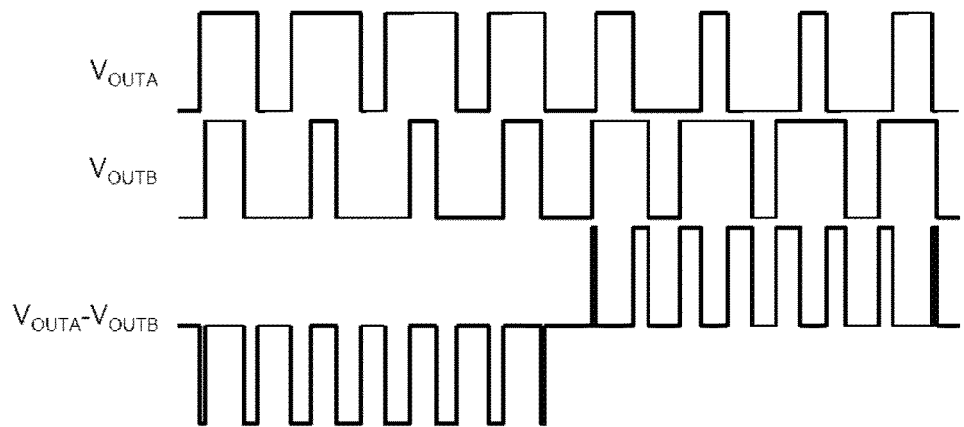
FIG. 4 shows the output signals for the amplifier design of FIG. 1(b)

There is a remote possibility that overcurrent is detected in both bridge-halves simultaneously. In this case, the two hold signals would go high simultaneously, yielding a deadlock where both bridge-halves would prevent the other from switching. This is resolved by granting one of the bridge-halves priority over the other. The effect of this mechanism is already shown in FIG. 3 where FIG. 3(b) shows the situation where coinciding edges occur in combination with an overcurrent and FIG. 3(a) shows the same situation with the solution described above (the 20 ns delay) implemented.

The solution described above does not solve the shutdown coincidence problem. This is because in this condition there is usually no overcurrent. One solution would be to simply delay the shutdown of one of the bridge-halves with respect to the other such that the final transitions can never coincide. However, for a loudspeaker application, this has the potential drawback of generating audible shutdown pop in the loudspeaker. If no signal is applied then both bridge-halves are switching simultaneously with 50% duty-cycle and the output current is zero. In this case it is actually desirable to shut down both bridge-halves simultaneously.

A very simple solution is to delay shutdown of a half-bridge only when the instantaneous output is high. If the instantaneous output is low then no delay is applied. In this way, both bridge halves shut down at the same time when they are switching in-phase. Only if the outputs of the bridge-halves are not equal the shutdown of one bridge-half is delayed. The delay can be quite small, e.g. in the order of 20 ns.

This approach does not require any communication between half-bridges. It implements a delay in both half-bridges if the outputs are both high, and no delay in both half-bridges if the outputs are both low. Of course, the delay could instead only be when the instantaneous output is low.

Figure 1:
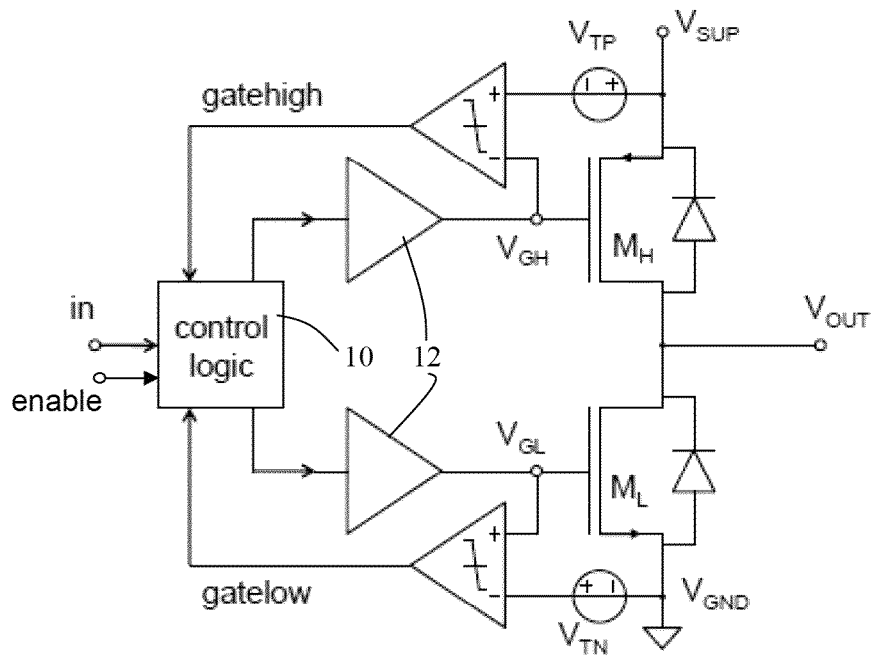
FIG. 1 shows two known class D amplifier designs.
Figure 1:
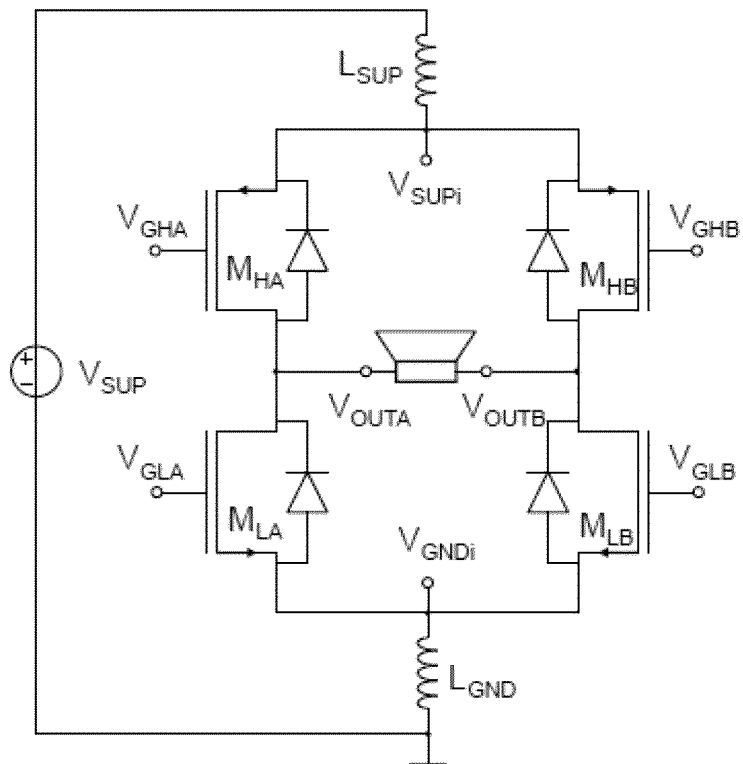
Figure 2:
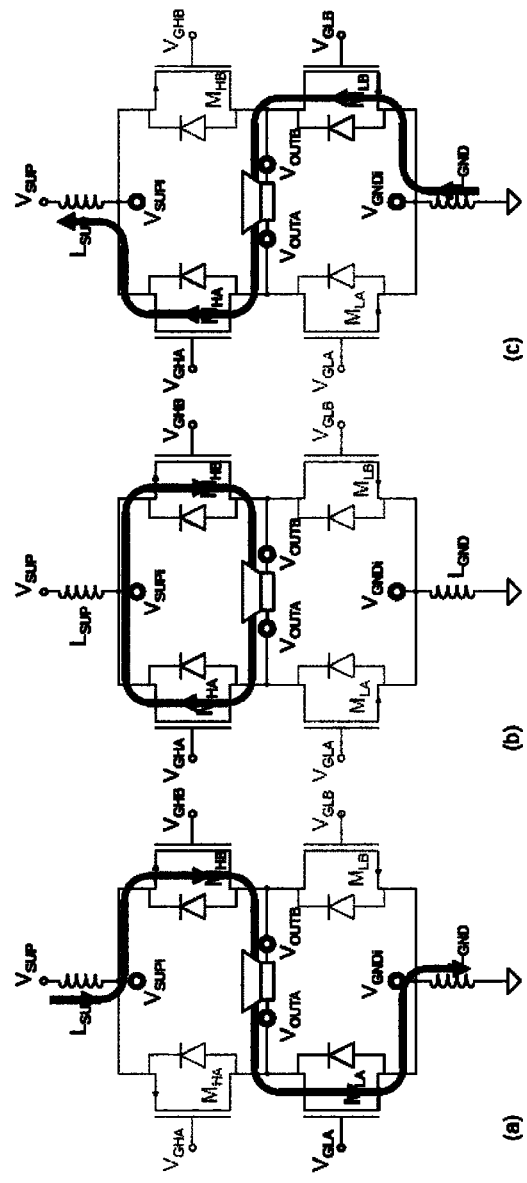
FIG. 2 shows the current paths during switching of the amplifier design of FIG. 1(b)
Figure 8:
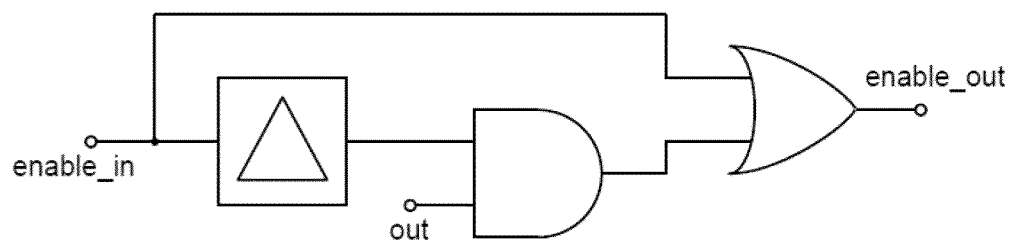
FIG. 8 shows how a delay can be implemented for the control of the amplifier design of the invention.

FIG. 8 shows a very simple logic circuit that applies a delay to the falling edge of an enable signal only if the output is high. The resulting signal ("enable_out") can comprise the "enable" signal applied to the control logic as shown in FIG. 1(a), and the falling edge corresponds to a shut down command. When the "enable" signal is low, both power transistors are switched off leaving the output node in a high-impedance state. When the "enable" signal is high, the output node switches normally, according to the value of input signal "in".

As shown in FIG. 8, an enable signal "enable_in" is delayed by a delay element before being combined with AND logic with the output signal "out".

The AND result is combined with the "enable_in" signal with OR logic. The result is that the "enable_out" signal is prolonged by the amount of the delay if "out" is high (because there is an OR combination of a signal and a delayed version of itself).

The circuit of FIG. 8 is inserted between the "enable" input to the control logic and the control logic for each of the half-bridges. Thus, the enable_out signal of FIG. 8 is applied as the "enable" signal to the control logic as shown in FIG. 1(a).

This approach can be combined with a DC-DC converter

Figure 9:
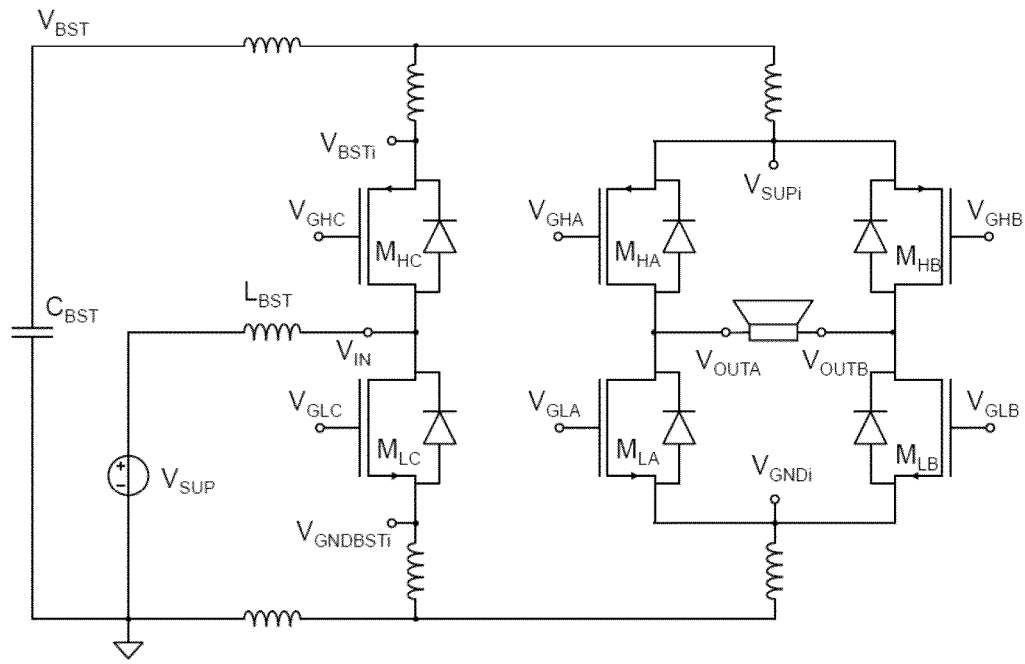
FIG. 9 shows the amplifier design of the invention used as the output stage of a DC-DC converter.

Currently, class-D amplifiers in combination with a DC-DC boost converter are becoming popular to increase output power. In such an arrangement there are actually three switching half-bridges that share a common supply rail as shown in FIG. 9.

The output stage is exactly as shown in FIG. 1(b).

This example of DC-DC boost converter consists of a large NMOS and PMOS power transistor $M_{LC}$ and $M_{HC}$, an external-inductor $L_{BST}$ and an external capacitor $C_{BST}$. It boosts the supply voltage $V_{SUP}$ to a higher value $V_{BST}$. In order to do so, the power transistors $M_{LC}$ and $M_{HC}$ switch the input node $V_{IN}$ up and down between the output $V_{BST}$ and ground.

The current through inductor $L_{BST}$ can be considered constant during transitions of $V_{IN}$ and is switched between ground and $V_{BST}$. Similar to the class-D power stage this causes large and fast changes in the current that in turn yield large voltage excursions across the parasitic inductances in the current loops. Typically the DC-DC booster output voltage $V_{BST}$ and the class-D supply voltage are connected off-chip to the booster capacitor $C_{BST}$.

Depending on the exact geometry of the application this can translate into different networks of parasitic inductors of which FIG. 9 is only one example.

Typical values for $L_{BST}$ and $C_{BST}$ in mobile applications are 1 µH and 10 µF respectively. In order to deliver a few Watts of output power with these component values the DC-DC boost converter needs to switch very fast, e.g. 2 MHz which is 5 to 6 times faster than the class-D amplifier. Also, when the booster is active the current is certainly high or it would make no sense to use the booster in the first place. Again it makes sense to avoid coincidental switching of the power stages to prevent addition of voltage excursions.

In this case it is better to delay the transitions of the DC-DC booster in favour of amplifier transitions because the requirements on the boosted voltage $V_{BST}$ are generally less stringent than those for the audio output $V_{OUTA}$–$V_{OUTB}$. If a transition of the DC-DC boost converter is delayed because of a coinciding transition of the class-D amplifier this can be modelled as a (random) time disturbance. It can be expected that the control loop of the DC-DC boost converter is able to deal with time disturbances. The same techniques used for the overcurrent coincidence can be applied here.

Figure 10:
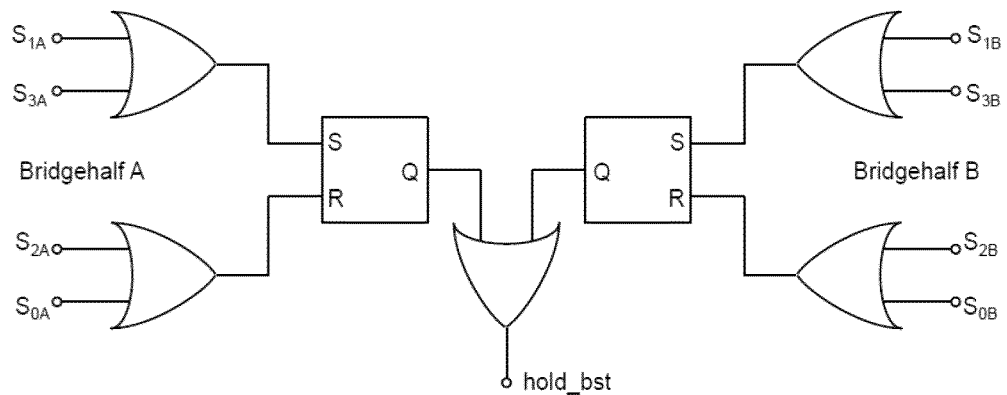
FIG. 10 shows how a hold signal can be generated for controlling the DC-DC converter.

The circuit shown in FIG. 10 generates a signal hold_bst that indicates that one or both bridge-halves of the class-D amplifier are in transition. The signal "hold_bst" is then tapped into the control state-machine of the DC-DC boost converter similar to that shown in FIG. 7.

The "hold_bst" signal is generated by the amplifier half-bridges and only stops (or actually delays) the switching of the boost converter half-bridge. The boost converter half-bridge has no influence on the switching of the amplifier half-bridges. The result is that the boost converter only switches when the amplifier is not switching. The control logic for all three half-bridges is the same and is described by the state-diagram in FIG. 7.

As shown in FIG. 10, the "hold_bst" signal is based on the current states of the amplifier half-bridges. For each half-bridge, an output signal is generated when the intermediate states $S_1$ or $S_3$ are entered. The output state is reset when the states $S_2$ or $S_0$ are entered. Thus, the hold signal is applied to the DC-DC boost converter when the amplifier is switching between the output states $S_0$ and $S_2$.

The invention can be realised as logic functions that can be implemented using standard CMOS or any other type of logic.

The invention can be used in class-D audio amplifiers, DC-DC converters and combinations of both.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measured cannot be used to advantage. Any reference signs in the claims should not be construed as limiting the scope.

The invention claimed is:

1. A Class D power amplifier for driving a load between first and second output nodes, comprising:
   a first output half-bridge circuit comprising first, highside, and second, lowside, transistors in series between power rails, with the first output node between the first and second transistors;
   a second output half-bridge circuit comprising third, highside, and fourth, lowside, transistors in series between power rails, with the second output node between the third and fourth transistors;
   a first controller circuit of the first output half-bridge circuit for generating gate drive signals for the highside and lowside transistors in the first output half-bridge circuit; and
   a second controller circuit of the second output half-bridge circuit for generating the gate drive signals for the highside and lowside transistors in the second output half-bridge circuit,
   wherein the first and second controller circuits are adapted to:
   derive an amplifier hold signal in response to an overcurrent state being detected in one output half-bridge circuit and an output state of one of the half-bridge circuits, and to prevent switching of the other output half-bridge circuits based on the hold signal.

2. An amplifier as claimed in claim 1, wherein the controller circuits each comprise an asynchronous logic circuit for generating the amplifier hold signal.

3. An amplifier as claimed in claim 2, wherein the asynchronous logic circuit comprises, for each output half-bridge circuit, a first latch for generating a first output in response to detecting an overcurrent in the lowside transistor and the output state of the amplifier is a first state in which the half-bridge circuit pulls its output node down, and a second latch for generating a second output if overcurrent is detected in the highside transistor and the output state of the half-bridge circuit is a second state in which the half-bridge circuit pulls its output node up, wherein an output half-bridge hold signal (hold) comprises the logical OR of the first and second outputs.

4. An amplifier as claimed in claim 3, wherein the controller circuits are further adapted to:
   use the amplifier hold signal to prevent switching of the other output bridge circuit out of the first and second output states if the switching has not commenced; and
   return the other output half-bridge circuit to the first or the second output states if the switching out of the state has commenced but switching off of a transistor has not been completed.

5. An amplifier as claimed in claim 1, wherein the controller circuits are further adapted, in response to a signal, to shut down the amplifier, to delay shutdown of one output half-bridge circuit with respect to the other half-bridge circuit only if one half-bridge circuit output is high and the other is low.

6. An amplifier as claimed in claim 5, wherein each controller circuit comprises a synchronous logic circuit to delay a shut down signal for the respective output half-bridge circuits only if the half-bridge circuit output has predetermined value, and wherein the predetermined value is the same for the two output half-bridge circuits.

7. A method of controlling a Class D power amplifier which drives a load between first and second output nodes, the amplifier comprising:
   a first output half-bridge circuit comprising first, highside, and second lowside, transistors in series between power rails, with the first output node between the first and second transistors; and
   a second output half-bridge circuit comprising third, highside, and fourth, lowside, transistors in series between power rails, with the second output node between the third and fourth transistors, wherein the method comprises:
   for each output half-bridge circuit, controlling the output half-bridge circuit to define a first output state in which the output half-bridge circuit pulls the output node down to the low power rail, and a second output state in which the output half-bridge circuit pulls the output node up to the high power rail; and
   deriving an amplifier hold signal when an overcurrent state is detected in one output half-bridge circuit, and using the hold signal to prevent switching of the other output half-bridge circuit between the first and second output states, while maintaining the one output half-bridge circuit in one of the output states.

8. A method as claimed in claim 7, further comprising, for each output half-bridge circuit, generating a first output from a latch if overcurrent is detected in the lowside transistor and the output state of the amplifier is the one in which the half-bridge circuit pulls its output node down, and generating a second output from a latch if overcurrent is detected in the highside transistor and the output state of the amplifier is the one in which the half-bridge circuit pulls its output node up, and generating an output half-bridge hold signal as the logical OR of the first and second outputs.

9. A method as claimed in claim 7, further comprising:
   using the amplifier hold signal to prevent switching of the other output bridge circuit out of the first and second output states if the switching has not commenced; and
   return the other output bridge circuit to the first or second output states if the switching out of the state has commenced but switching off of a transistor has not been completed.

10. A method as claimed in claim 7, further comprising, in response to a signal to shut down the amplifier, delaying shutdown of one output half-bridge circuit with respect to the other output half-bridge circuit only if one output half-bridge output is high and the other is low.

11. A method as claimed in claim 10, further comprising delaying a shut down signal for the respective output half-bridge circuits only if the output half-bridge output has predetermined value, and wherein the predetermined value is the same for the two output half-bridge circuits.

* * * * *